United States Patent
Kuo

(10) Patent No.: US 6,673,634 B2
(45) Date of Patent: Jan. 6, 2004

(54) WAFER PROTECTION METHOD

(75) Inventor: Chin-Ting Kuo, Panchiao (TW)

(73) Assignee: Calitech Co., Ltd., Hsinchu (TW)

( * ) Notice: Subject to any disclaimer, the term of this patent is extended or adjusted under 35 U.S.C. 154(b) by 0 days.

(21) Appl. No.: 10/173,196

(22) Filed: Jun. 17, 2002

(65) Prior Publication Data

US 2003/0121890 A1 Jul. 3, 2003

(30) Foreign Application Priority Data

Dec. 31, 2001 (TW) ........................................ 90133216 A

(51) Int. Cl.[7] ............................................... H01L 21/68
(52) U.S. Cl. ................................ 438/7; 438/692; 451/6
(58) Field of Search ............................. 438/8, 9, 10, 11, 438/12, 13, 14, 15, 16, 17, 18, 7, 692; 451/6, 211; 216/89; 382/145, 152

(56) References Cited

U.S. PATENT DOCUMENTS

| | | | | |
|---|---|---|---|---|
| 5,196,353 A | * | 3/1993 | Sandhu et al. ................. 438/5 |
| 5,720,845 A | * | 2/1998 | Liu ........................ 156/345.13 |
| 6,293,846 B1 | * | 9/2001 | Oguri ............................. 451/6 |
| 6,341,995 B1 | * | 1/2002 | Lai et al. ........................ 451/6 |
| 2001/0015801 A1 | * | 8/2001 | Hirose et al. ............. 356/237.2 |
| 2002/0137434 A1 | * | 9/2002 | Choi et al. ..................... 451/28 |

* cited by examiner

Primary Examiner—Carl Whitehead, Jr.
Assistant Examiner—Stephen W. Smoot
(74) Attorney, Agent, or Firm—Ladas & Parry

(57) ABSTRACT

The present invention discloses a method and a system of wafer protection of a chemical mechanical process. It takes an image on the polishing pad, and analyzes and identifies the image. If the wafer is out of a polishing head, a signal will be sent to the chemical mechanical polishing station to respond adequately. Otherwise, repeats the image obtaining and its following analysis and identification. The present invention can avoid broken wafers and reduce the station recovery time. Hence, it can increase the up time and the throughput of the station.

6 Claims, 4 Drawing Sheets

WAFER PROTECTION METHOD

BACKGROUND OF THE INVENTION (A) Field of the Invention

The present invention relates to a wafer protection method and system. More particularly, it relates to a wafer protection method and system using in chemical mechanical polishing process.

(B) Description of Related Art

Referring to FIG. 1, generally, as for present chemical mechanical polishing station, a wafer 11 is carried in place with a polishing head 13, and a retaining ring 12 is used to confine the wafer 11 to prevent the wafer 11 sliding out of the polishing head 13 during polishing. The polishing head 13 controlled by a robot arm (not shown) moves to above the polishing turntable and then processes wafer polishing with a polishing pad.

The prior art generally uses a spring sensor 14 or an optical sensor (not shown) to sense whether the wafer 11 exists in the polishing head 13 or not. While the wafer 11 is being polished, the spring sensor 14 compressed by the wafer 11 and a signal is transmitted to the station to ensure that the wafer 11 is in the polishing head 13. If the wafer 11 slides out of the polishing head 13, the spring sensor 14 would detect it by pressure release and send a shut down signal to the station for maintenance. However, the above manner has following disadvantages:

1. As a process or a recipe is modified, usually with pressure increase of the polishing head 13 for improvement of polishing rate and uniformity, the deflection of the wafer 11 or unstable pressure is often induced, resulting in error messages of the spring sensor 14.
2. During processing with the same recipe, due to the variation between each polishing head 13 and each spring sensor 14, the one sensitive to process will get error message easily.
3. After use for a long time, due to the aging of the parts of the station (e.g. the diaphragm, contacting the wafer 11, in the polishing head 13), the probability of error message will increase.

If the spring sensor 14 cannot detect the separate status of the wafer 11 and the polishing head 13, the collision of the slipped out wafer and the parts of the station will result in wafer be broken. Hence, this event increases the cost but also reduce the throughput due to the stop of the polishing process for station washing.

Another prior art uses a camera to monitor the whole polishing process, and which is watch by a staff at a remote control station. However, the above manner cannot halt the station instantly as the wafer slips out, and at most prevent the next coming wafer 11 from being continuously brought in the failed station causing even more damage. The artificial monitor manner will get error frequently, higher cost and management problem.

Summarized mentioned above, because the chemical mechanical polishing process is one of the extremely important processes in semiconductor manufacture, how to detect the sliding of the wafer 11 and immediately halt the station for cost reduction and throughput improvement is becoming a critical problem in semiconductor industry.

SUMMARY OF THE INVENTION

The object of the present invention is to provide a wafer protection method and system of the chemical mechanical polishing station for preventing wafer damage and reducing the probability of the station shut down due to error message. The present invention uses images obtained during polishing rather than the sensor of the polishing head used in prior art for wafer positioning. Hence, there is no sensor error message occurred, and more stable and higher quality judgment can be obtained. Further, the present invention entirely uses images for wafer position judgment. Hence, a sensor for detecting the beginning of the image analysis and identification is unnecessary.

An embodiment of the wafer protection method of the chemical mechanical polishing station of the present invention uses a camera to obtain a image in front of the rotation path of the polishing pad. If the brightness of the image exceeds a predetermined threshold, it means said wafer is away from the press of the robot arm, then a warning issued or the chemical mechanical polishing station is shut down.

An embodiment of the wafer protection system of the present invention includes a chemical mechanical polishing station, a polishing head, at least a camera, a computer and a remote I/O module. The chemical mechanical polishing station includes a polishing pad rotating in a specific direction. The polishing head is used to press a wafer to contact the polishing pad. The camera is used to obtain the image of the wafer in front of the rotation path of the polishing pad. The computer is used for analyzing the image obtained by the camera. If the computer finds any abnormal phenomenon, the remote I/O module will halt the operation of the chemical mechanical polishing station.

DETAILED DESCRIPTION OF THE INVENTION

Figure 1:
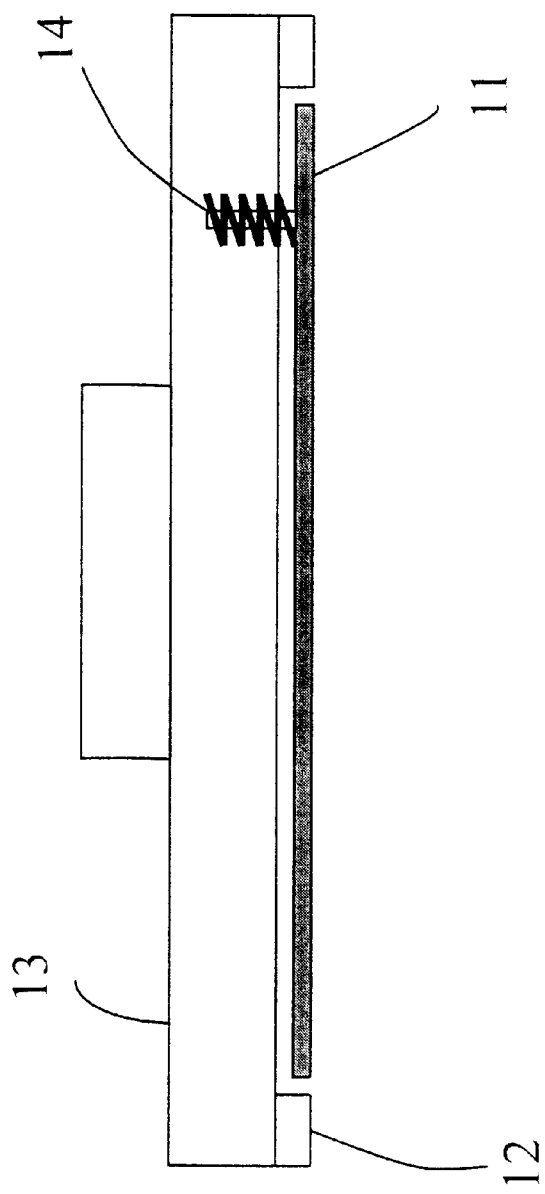
FIG. 1 illustrates a wafer sensing apparatus of prior art.
Figure 2:
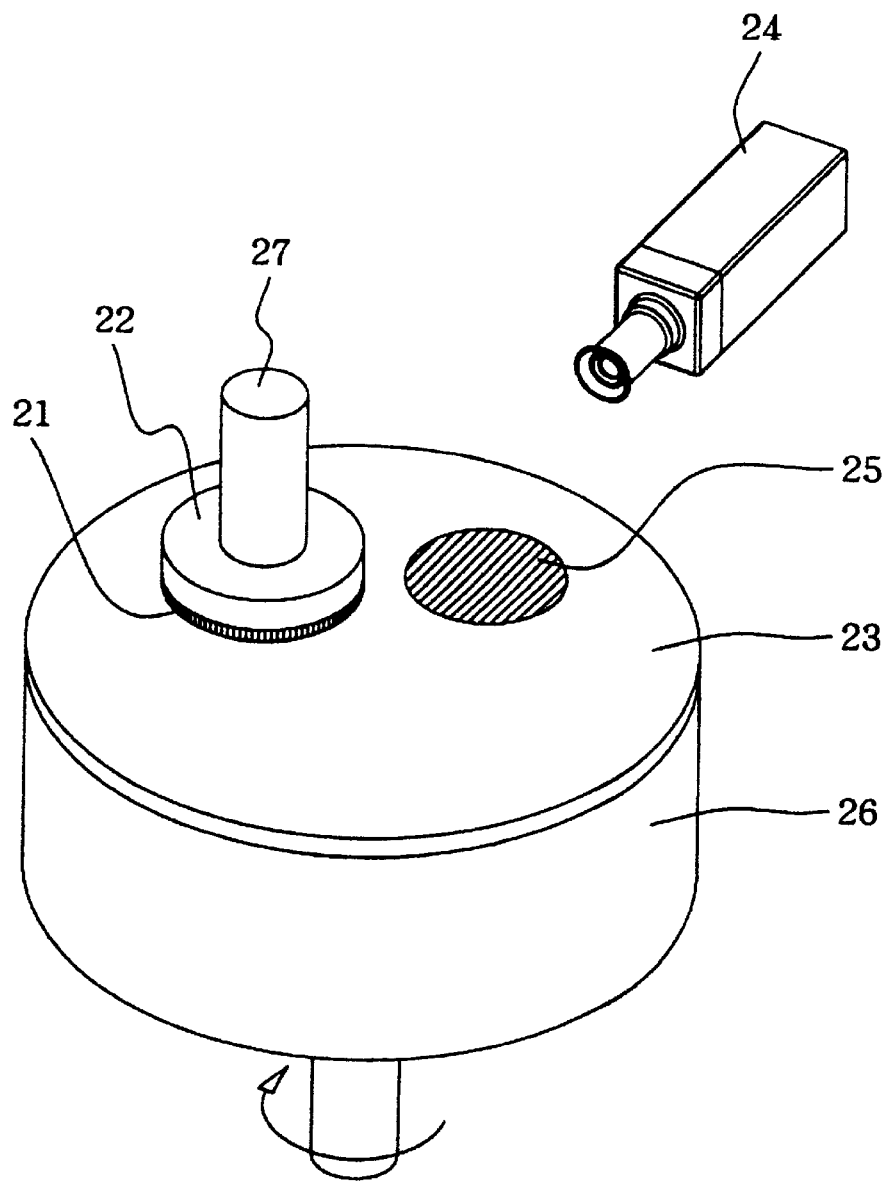
FIG. 2 illustrates the wafer protection system of a chemical mechanical polishing station in accordance with the present invention.

Referring to FIG. 2, a polishing turntable 26 rotates clockwise, and a wafer 21 is pressed by a polishing head 22 and a robot arm 27 to contact a polishing pad 23. Under normal operation, the wafer 21 is pressed by the polishing head 22 to tightly touch the surface of the polishing pad 23, and the planarization of wafer 21 is achieved by rotational friction of the polishing pad 23 against the surface of the wafer 21. However, under some special condition, such as the polishing head 22 cannot push the wafer 21 into contact with the surface of the polishing pad 23 tightly, it may induce the wafer 21 sliding along the rotational direction of the polishing turntable 26 (wafer out). In addition, if the wafer 21 slips out of the polishing table 26 or collides undesirably with other station components, the wafer 21 may be damaged. To prevent the happening of the event mentioned above, the present invention uses a camera 24 to obtain an image of the wafer 21 in a specific region 25 in front of the rotational direction of the polishing turntable 26. The specific region 25 must be in the path of the wafer 21 slipped and can be determined by a staff. Hence, if the wafer 21 slips out, surely the camera 24 can be able to obtain the image and send out a warning message. Generally, the brightness of the polishing pad 23 is lower than that of the wafer 21 due to the shining wafer surface. The staff can determine a threshold value higher than the brightness of the polishing pad 23 and lower than that of the wafer 21 by oneself according to the color level of the image. In other word, under normal operation, the brightness obtained by camera 24 is lower than the threshold value. However, as the wafer 21 slips out, the brightness obtained by the camera 24 is higher than the threshold value.

The image obtained by the camera 24 may be transmitted to an image processing system (not shown) for analysis. To prevent the impact of the image analysis by abnormal reflection light nearby the station, the highest brightness region of image obtained by the camera 24 is processed, and that of less brightness is ignored. When the image analysis shows slipping of the wafer 21, a warning will be issued immediately and the chemical mechanical polishing station will be shut down to prevent the wafer 21 from damage. To further analyze the reason of the wafer 21 sliding, the image obtained by the camera 24 may be saved as a BMP or AVI image file for providing to a staff for the station design defects research and further improvement.

Figure 3:
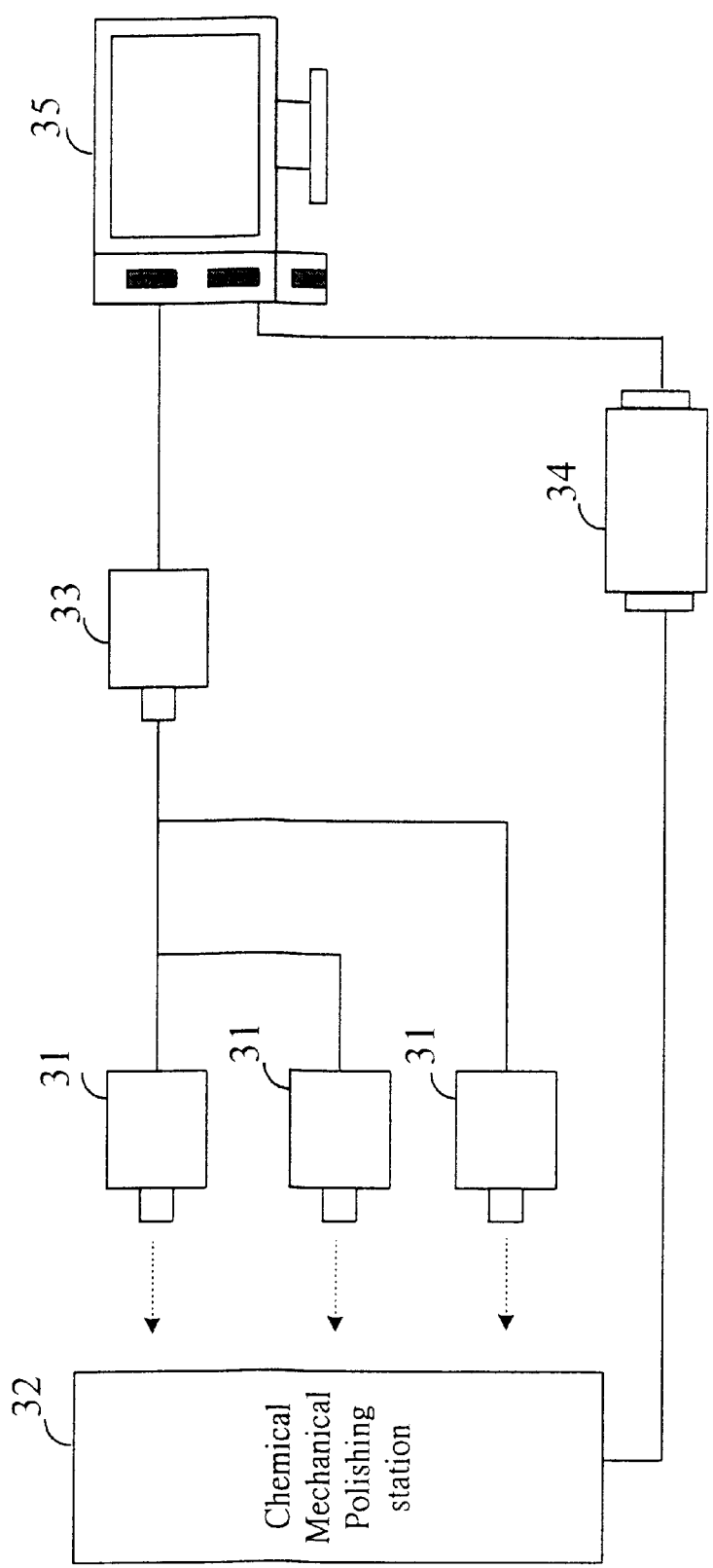
FIG. 3 illustrates the image processing and wafer protection system in accordance with the present invention.

FIG. 3 is the image processing and protection system of the present invention, including three high resolution camera (e.g. Charge Coupled Device; CCD) 31 established above the three polishing turntable of the chemical mechanical polishing station 32, and the image of the three polishing turntable can be obtained simultaneously; an image capture card 33 receives the image obtained by the CCD camera 31; a computer 35 connected to the image capture card 33 executes a wafer monitor system program and proceed the analysis and identification of the obtained image; a remote I/O module 34 receives the command from the computer 35 and connects to the chemical mechanical polishing station 32 to make the chemical mechanical polishing station 32 respond properly.

Figure 4:
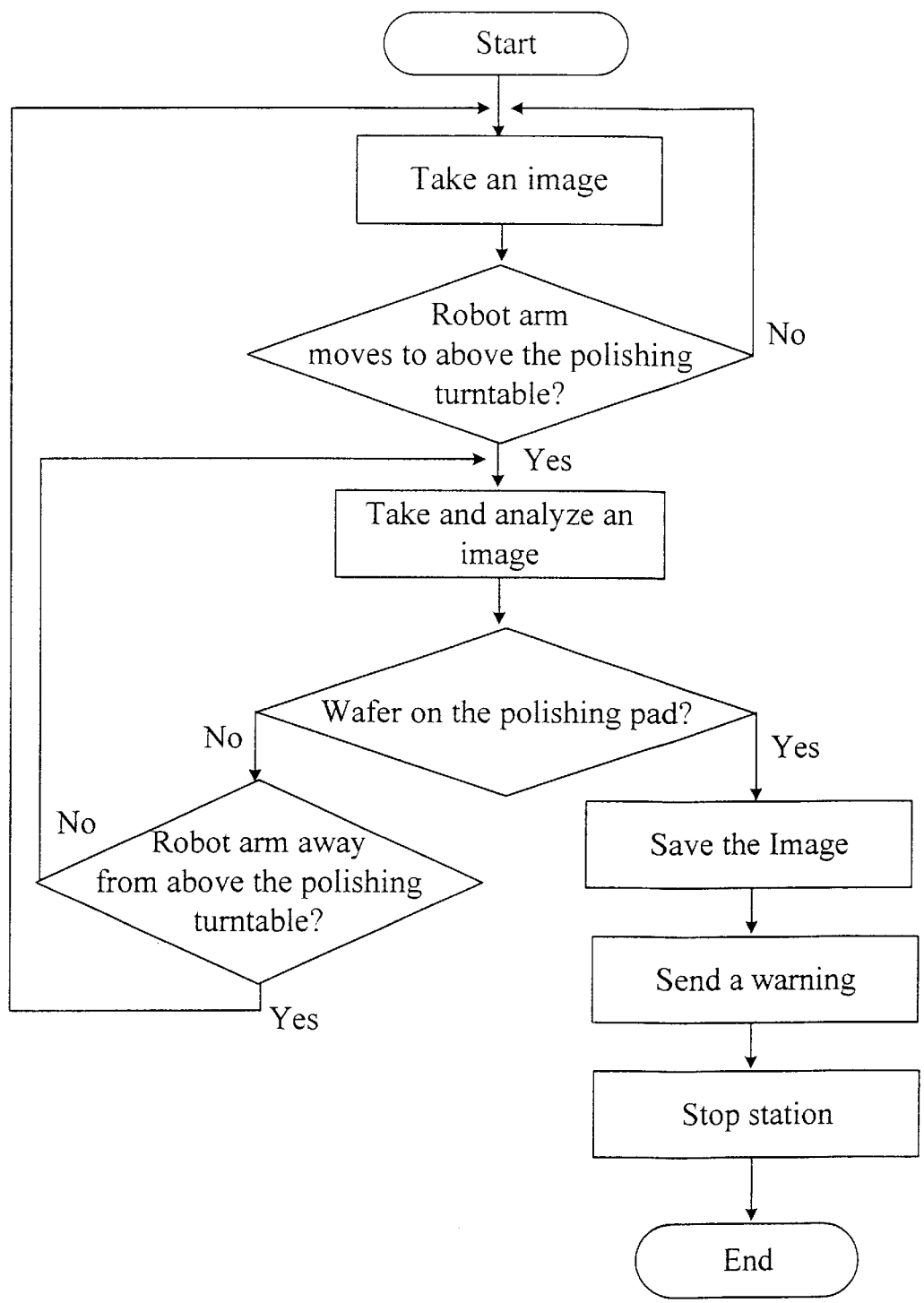
FIG. 4 is the wafer protection flow chart of a chemical mechanical polishing station in accordance with the present invention.

FIG. 4 is the flow chart of the wafer protection of the chemical mechanic polishing station of the present invention. First, the CCD camera 31 takes an image on the polishing turntable, and then the image is transferred to the computer 35 via the image capture card 33. The computer 35 further processes first stage analysis and identification of the image via the wafer monitor system program to identify the robot arm position or to ensure the station is ready for polishing. If robot arm is located above polishing turntable, the next image will be taken and the second stage analysis and identification will be performed. If the result of the first stage analysis and identification is that the robot arm is not located above the polishing turntable, the image on the polishing turntable will be continuously taken, and then the first analysis and identification and the follow-up operation will be performed also. The second stage analysis and identification is to identify any wafer located on the polishing pad. If a wafer is on the polishing pad, the image of the wafer on the polishing pad will be saved as a bmp or AVI file in the hard disk of the computer 35 for station troubleshooting and repair. Furthermore, the remote I/O module 34 will send a digital signal to the chemical mechanical polishing station 32 to stop the station 32 for prevention of wafer broken If the second analysis and identification shows no wafer on the polishing pad, the third stage of analysis and identification of the image will be proceeded to identify the robot arm position at this time. If the robot arm is still above the polishing turntable, the image on the polishing turntable will be taken continuously, and the second stage analysis and identification and the follow-up operation will be performed. Otherwise, the image on the polishing turntable will be taken continuously, and the first stage analysis and identification and the follow-up operation will be performed as well.

The system takes the image since the station begins to operate, and when the robot arm moves into the CCD camera 31 shooting region, that is the polishing head moves into the region above the polishing turntable, the image analysis and identification begins. The image-shooting region can be predetermined by the users oneselves.

The above-described embodiment of the present invention are intended to be illustratively only. Numerous alternative embodiments may be devised by those skilled in the art without departing from the scope of the following claims.

What is claimed is:

1. In a method for protecting a wafer in a chemical mechanical polishing station for being pressed to contact a polishing pad of said chemical mechanical polishing station by a polishing head carried by a robot arm, the improvement of said method comprising the steps of:

capturing images of a region located in a rotating path in front of said wafer by a camera;

analyzing said images to identify a wafer located on said polishing pad if said image shows that said robot arm is above said polishing pad; and stopping said chemical mechanical polishing station if a brightness level of said image is higher than a predetermined threshold representing said wafer is away from the press of said polishing head.

2. The method of claim 1, wherein only a brightest region of said image will be taken into treatment.

3. The method of claim 1, wherein said region and said predetermined threshold can be determined by a staff oneself.

4. The method of claim 1, wherein said images can be saved as a file for a further analysis.

5. The method of claim 1, wherein said camera is connected to a remote controller for an instant monitoring.

6. The method of claim 1, wherein said camera takes said images when said chemical mechanical polishing station begins to polish said wafer, and the analysis and identification of said images are started when said polishing head moves to above said polishing pad.

* * * * *